United States Patent
Yu et al.

(10) Patent No.: US 11,133,487 B2
(45) Date of Patent: Sep. 28, 2021

(54) LIGHT EMITTING DIODE, METHOD FOR PREPARING THE SAME, AND DISPLAY DEVICE

(71) Applicant: BOE TECHNOLOGY GROUP CO., LTD., Beijing (CN)

(72) Inventors: Gang Yu, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/630,595

(22) PCT Filed: Jul. 1, 2019

(86) PCT No.: PCT/CN2019/094260
§ 371 (c)(1),
(2) Date: Jan. 13, 2020

(87) PCT Pub. No.: WO2020/007268
PCT Pub. Date: Jan. 9, 2020

(65) Prior Publication Data
US 2020/0176704 A1    Jun. 4, 2020

(30) Foreign Application Priority Data
Jul. 2, 2018 (CN) .......... 201810706678.X

(51) Int. Cl.
*H01L 51/52* (2006.01)
*H01L 51/00* (2006.01)
*H01L 51/50* (2006.01)

(52) U.S. Cl.
CPC ...... *H01L 51/5234* (2013.01); *H01L 51/0021* (2013.01); *H01L 51/5072* (2013.01); *H01L 2251/552* (2013.01)

(58) Field of Classification Search
CPC ............ H01L 51/5234; H01L 51/0021; H01L 51/5072; H01L 2251/552
See application file for complete search history.

(56) References Cited

U.S. PATENT DOCUMENTS

| 2005/0056859 A1 | 3/2005 | Liu et al. |
| 2006/0108580 A1 | 5/2006 | Yoshida et al. |

(Continued)

FOREIGN PATENT DOCUMENTS

| CN | 1822730 A | 8/2006 |
| CN | 1883062 A | 12/2006 |

(Continued)

OTHER PUBLICATIONS

First Office Action for Chinese Application No. 201810706678.X, dated Jul. 16, 2019, 6 Pages.

(Continued)

*Primary Examiner* — Anthony Ho
(74) *Attorney, Agent, or Firm* — Brooks Kushman P.C.

(57) ABSTRACT

The present disclosure provides a light emitting diode, a method of preparing the same, and a display device. The light emitting diode includes an anode, a light emitting layer, an electron transport layer, a cathode, and a metal transition layer located between the electron transport layer and the cathode, the cathode including a transparent conductive oxide material, and a material of the metal transition layer having a work function $W_F$ between an LUMO of a material of the electron transport layer and a work function $W_F$ of a material of the cathode.

20 Claims, 6 Drawing Sheets

(56) References Cited

U.S. PATENT DOCUMENTS

2009/0167163 A1 7/2009 Kim et al.
2011/0043103 A1 2/2011 Morishima

FOREIGN PATENT DOCUMENTS

| CN | 101405366 A | 4/2009 |
| CN | 101983538 A | 3/2011 |
| CN | 102185111 A | 9/2011 |
| CN | 108807709 A | 11/2018 |
| JP | 5828518 B2 | 12/2015 |

OTHER PUBLICATIONS

Second Office Action for Chinese Application No. 201810706678.X, dated Mar. 27, 2020, 3 Pages.

LIGHT EMITTING DIODE, METHOD FOR PREPARING THE SAME, AND DISPLAY DEVICE

CROSS-REFERENCE TO RELATED APPLICATIONS

This application is the U.S. national phase of PCT Application No. PCT/CN2019/094260 filed on Jul. 1, 2019, which claims priority to Chinese Patent Application No. 201810706678.X filed on Jul. 2, 2018, which are incorporated herein by reference in their entireties.

TECHNICAL FIELD

The present disclosure relates to the field of display technology, in particular, to a light emitting diode, a method for preparing the same, and a display device including the same.

BACKGROUND

In current social life, people's demand on display devices goes higher and higher. Although the active matrix organic light emitting diode (AMOLED) display technology is called the next-generation new display technology, AMOLED at present is mainly prepared by mask evaporation method due to factors such as the service life, while the preparation method faces issues, such as high technical difficulty, difficulty in mass production, low product yield, and high commodity price.

SUMMARY

In an aspect, an embodiment of the present disclosure provides a light emitting diode, which includes an anode, a light emitting layer, an electron transport layer, a cathode, and a metal transition layer located between the electron transport layer and the cathode, in which the cathode includes a transparent conductive oxide material, and a material of the metal transition layer has a work function $W_F$ between an LUMO of a material of the electron transport layer and a work function $W_F$ of a material of the cathode.

Optionally, the metal transition layer is in contact with the cathode, and a surface of the metal transition layer in contact with the cathode has a roughness Rms greater than 1.0 nm, in which the roughness is a roughness measured in an AFM photograph and expressed in a calculated root mean square.

Optionally, a surface of the metal transition layer in contact with the cathode has a roughness of 1.0 nm to 5.0 nm.

Optionally, the metal transition layer is made of at least one metal of metals Al, In, Ag, and Sn.

Optionally, the metal transition layer is made of metal Sn, Sn—Al or Sn—Ag alloy.

Optionally, the metal transition layer is made of a mixed material of metal tin and an oxide of tin.

Optionally, the metal tin has a molar ratio of 50% or more in the mixed material.

Optionally, the metal transition layer has a thickness of 0.5 nm to 15 nm.

Optionally, a surface of the metal transition layer in contact with the cathode has a discontinuous island profile, and the island profile has a protruding height less than or equal to 10 nm.

In another aspect, the present disclosure provides a display device including the light emitting diode of any of the above items.

In still another aspect, the present disclosure provides a method for preparing a light emitting diode, including: preparing an anode, a light emitting layer, and an electron transport layer; preparing a metal transition layer; and preparing a cathode, the cathode being made of a material including a transparent conductive oxide, in which the metal transition layer is located between the electron transport layer and the cathode, and a material of the metal transition layer has a work function $W_F$ between an LUMO of a material of the electron transport layer and a work function $W_F$ of a material of the cathode.

Optionally, the metal transition layer is in contact with the cathode, and a surface of the metal transition layer in contact with the cathode has a roughness Rms greater than 1.0 nm, in which the roughness is a roughness measured in an AFM photograph and expressed in a calculated root mean square.

Optionally, the metal transition layer is made of at least one metal of metals Al, In, Ag, and Sn.

Optionally, the metal transition layer is made of a mixed material of metal tin and an oxide of tin.

Optionally, the step of preparing the metal transition layer on the electron transport layer includes: depositing a metal transition layer on the electron transport layer by a sputtering process, a thermal decomposition process, or an atomic layer deposition process.

Optionally, the metal transition layer has a deposition rate of 0.5 to 3 Å/s, the deposition rate being expressed by a thickness of a layer formed by deposition per unit time.

Optionally, the metal transition layer is made of a mixed material of metal tin and an oxide of tin, and the method further includes: performing an oxygen plasma treatment on a deposited tin, to produce the metal transition layer made of tin and an oxide of tin.

Optionally, the step of preparing the metal transition layer on the electron transport layer includes depositing metal Sn by thermally decomposing $SnH_4$ adduct, and depositing a metal transition layer on the electron transport layer.

DETAILED DESCRIPTION

Figure 1:
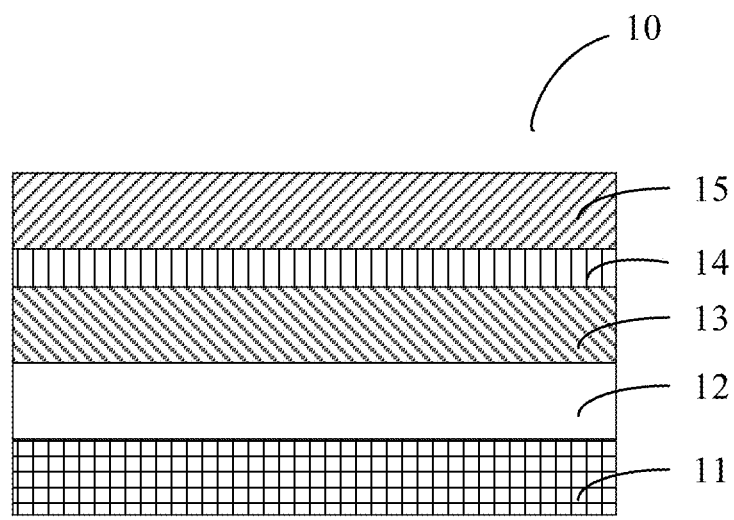
FIG. 1 is a schematic view showing a light emitting diode according to an embodiment of the present disclosure.

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may obtain the other embodiments, which also fall within the scope of the present disclosure.

The "metal transition layer" described in the present disclosure means a transition layer including a metal material. For example, the metal transition layer may be composed of a metal material or a material including a metal and a metal oxide. Optionally, the metal transition layer refers to a transition layer including a metal material having a main content of, for example, 50% or more.

In a top-emitting light emitting diode made by a solution method, an electron transport layer (ETL) is usually made of metal oxide nanoparticles having a high refractive index, e.g., zinc oxide, magnesium zinc oxide, or the like. If the light emitting diode uses a very thin metal transparent cathode, it faces issues, such as insufficient light transmittance and serious total reflection at interface. If the cathode of the light emitting diode is made of a completely transparent material (e.g., ITO, IZO, etc.), it is difficult to inject carriers since such material has a high work function (ITO is 4.7 eV, IZO is 5.1 eV). Therefore, how to easily inject the carriers of the cathode is a problem to be solved by the related art.

An embodiment of the present disclosure provides a light emitting diode, including an anode, a light emitting layer, an electron transport layer, a cathode, and a metal transition layer located between the electron transport layer and the cathode, the cathode including a transparent conductive oxide material, and a material of the metal transition layer having a work function $W_F$ between an LUMO of a material of the electron transport layer and a work function $W_F$ of a material of the cathode.

An embodiment of the present disclosure may produce the following advantageous technical effects: in the light emitting diode of the embodiment of the present disclosure, the carrier injection of the cathode can be facilitated by providing a suitable metal transition layer between the electron transport layer and the cathode, that is, the work function $W_F$ of the material of the metal transition layer is between the LUMO of the material of the electron transport layer and the work function $W_F$ of the material of the cathode. This can reduce the operating voltage applied to the light emitting diode, thereby increasing the service life of the light emitting diode.

In an optional embodiment of the present disclosure, the light emitting diode is a quantum dot light emitting diode, and the light emitting layer is a quantum dot light emitting layer.

FIG. 1 is a schematic view showing a light emitting diode according to an optional embodiment of the present disclosure. The light emitting diode 10 includes an anode 11, a quantum dot light emitting layer 12, an electron transport layer (ETL) 13, a metal transition layer 14, and a cathode 15.

The cathode 15 is made of a material including a transparent conductive oxide. The metal transition layer 14 is made of a material having a work function $W_F$ between an LUMO of the material of the electron transport layer and a work function $W_F$ of the material of the cathode. For example, the material of the metal transition layer may be at least one metal of metals Al, In, Ag, and Sn; or a mixed material of tin and an oxide of tin. The transition layer made of the above material can not only adjusts the difference in work function between the transparent conductive oxide layer (i.e., the cathode) and the electron transport layer, but also can increase the effective area of carrier injection of the cathode, thereby facilitating the carrier injection of the cathode.

Figure 7:
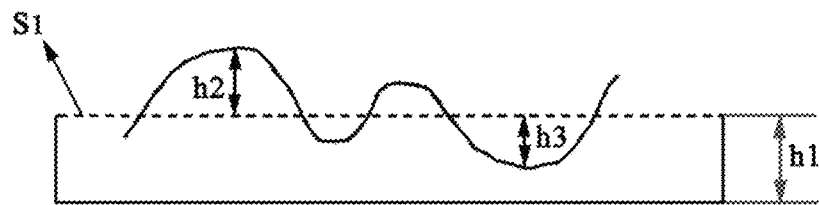
FIG. 7 is a schematic cross-sectional view showing a metal transition layer according to an embodiment of the present disclosure.

In an optional embodiment, when a cathode of a light emitting diode is made of a transparent conductive oxide material such as ITO or IZO, since such material has a high work function (for example, ITO is 4.7 eV and IZO is 5.1 eV), a metal transition layer can be prepared between the electron transport layer and the cathode to function as adjusting a work function. This can reduce the difficulty of carrier injection. Further, in the light emitting diode of an optional embodiment of the present disclosure, the surface of the metal transition layer made of the above material in contact with the cathode has a relatively high surface roughness. The surface roughness is a roughness measured in an AFM photograph and expressed by a calculated root mean square. Unless otherwise specified, the roughness of the present disclosure refers to the roughness measured and calculated according to this method. Optionally, the surface of the metal transition layer made of the above material has a discontinuous island profile, and further optionally, the island profile has a protrusion height less than or equal to 10 nm. This shape improves the effective area of carrier injection of the cathode, thereby facilitating the carrier injection. FIG. 7 is a cross-sectional view along a direction perpendicular to the surface of the metal transition layer in contact with the electron transport layer. As shown in FIG. 7, the standard line s1 is selected such that the sum of the areas of the projections protruding outward from the metal transition layer is equal to the sum of the areas of the recess portions recessed into the metal layer. The distance between the standard line s1 and the surface of the metal transition layer in contact with the electron transport layer is the thickness h1 of the metal transition layer, the distance between the highest point of each protrusion portion protruding outward and the standard line s1 is the protrusion height h2 of the protrusion portion, and the distance between the lowest point of each recess portion recessing inward and the standard line s1 is the recess height h3 of the recess portion. The surface roughness Rms of the present disclosure is obtained by calculating the root mean square of the height h2 of all the protrusions and the depth h3 of all the recess portions.

Figure 2:
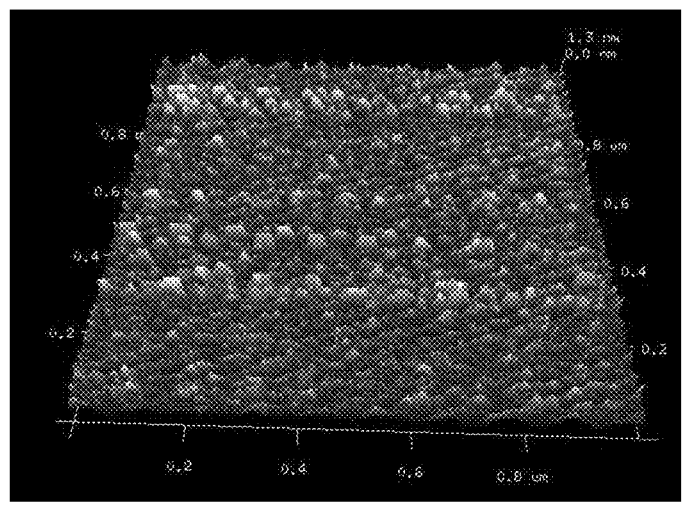
FIG. 2 is an AFM photograph of aluminum film with a thickness of 8 nm deposited on an electron transport layer.
Figure 3:
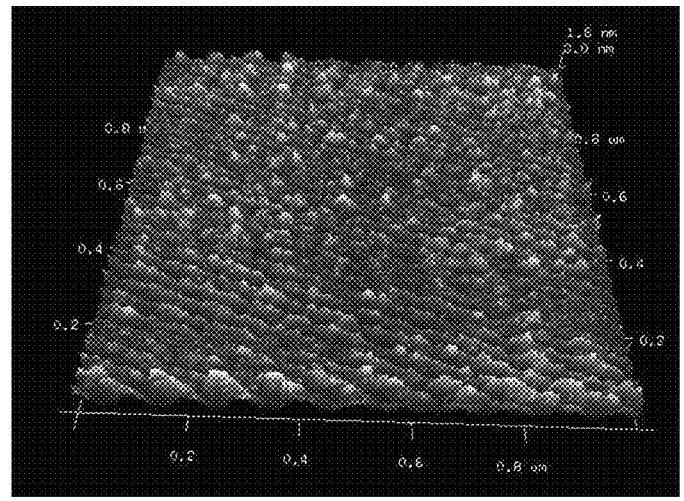
FIG. 3 is an AFM photograph indium film with a thickness of 8 nm deposited on an electron transport layer.
Figure 4:
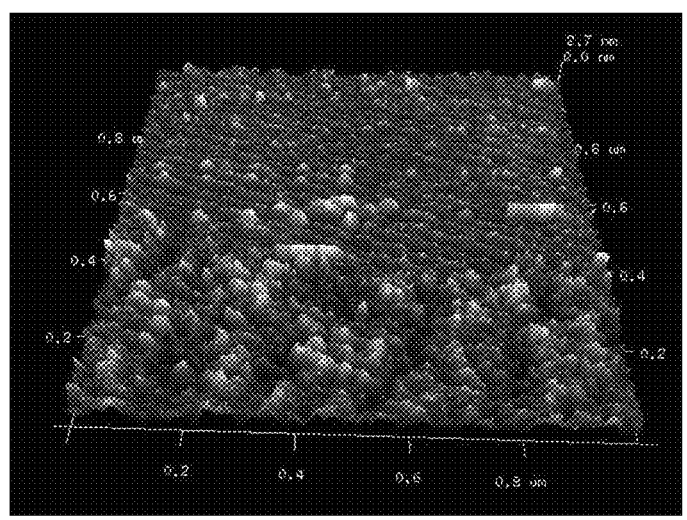
FIG. 4 is an AFM photograph tin film with a thickness of 8 nm deposited on an electron transport layer.
Figure 5:
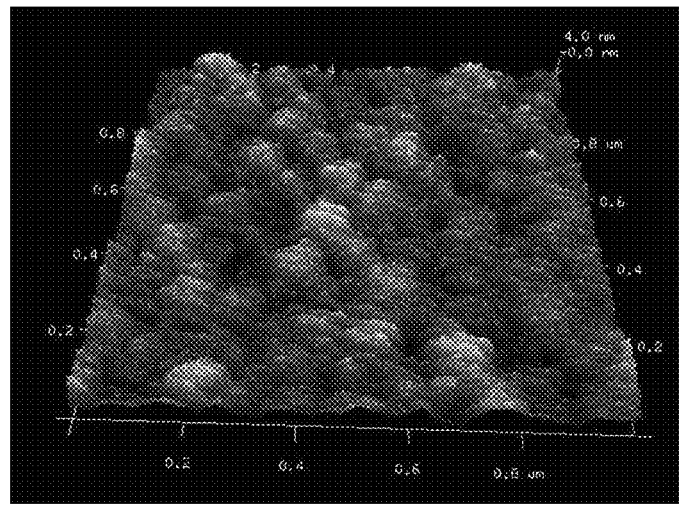
FIG. 5 is an AFM photograph indium film with a thickness of 8 nm deposited on a blank glass.
Figure 6:
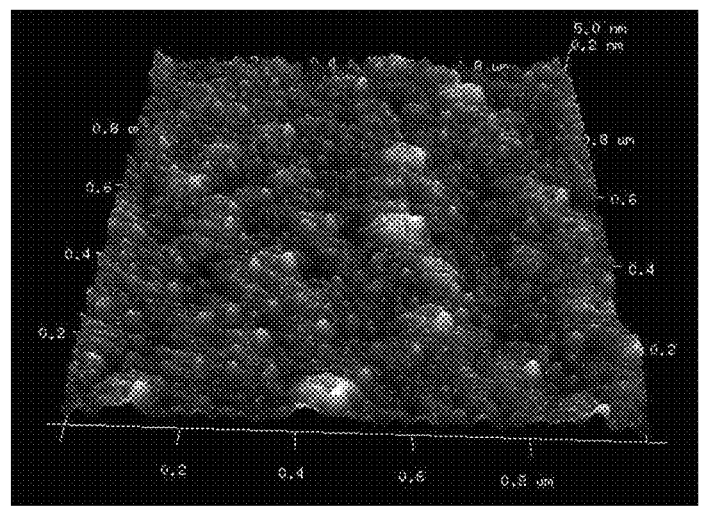
FIG. 6 is an AFM photograph tin film with thickness of 8 nm deposited on a blank glass.

Specifically, a metal transition layer of a QLED device is made of metals having similar work functions, such as aluminum (Al), indium (In), and tin (Sn). For example, a 5 to 10 nm thick metal transition layer is deposited on the electron transport layer by sputtering or evaporation in a vacuum deposition system at 0.5 to 3 Å/s. The work functions of aluminum, indium and tin are 4.3 eV, 4.1 eV and 4.4 eV, respectively. The metal transition layers made of these three metals are observed by atomic force microscope (AFM). Referring to FIG. 2 (Al), FIG. 3 (In) and FIG. 4 (Sn), it can be found that all three metals can form a rough surface with a discontinuous island profile, and the surface roughness of the metal transition layer is increased sequentially in an order from aluminum, indium to tin (1.3 nm, 1.6 nm, and 2.7 nm, respectively). That is, the surface of the metal transition layer made of tin has a discontinuous columnar shape and a relatively high roughness, and in particular, the surface of the metal transition layer made of metal Sn is the roughest. This result can also be demonstrated from FIGS. 5 and 6. FIGS. 5 and 6 show that a 5 to 10 nm thick metal transition layer is deposited on a blank glass by sputtering or evaporation in a vacuum deposition system at 0.5 to 3 Å/s, that is, FIGS. 5 and 6 merely differ from FIGS. 2 to 4 in that the substrates for deposition are different, while other processes for deposition are identical. As can be seen from FIGS. 5 and 6, metals In and Sn can form rough surfaces with discontinuous island profile having a roughness of 4.0 nm and 5.0 nm, respectively. The metal transition layer formed in the present disclosure has such morphology feature, which increases the effective area of carrier injection of the cathode, thereby facilitating the carrier injection.

Figure 8:
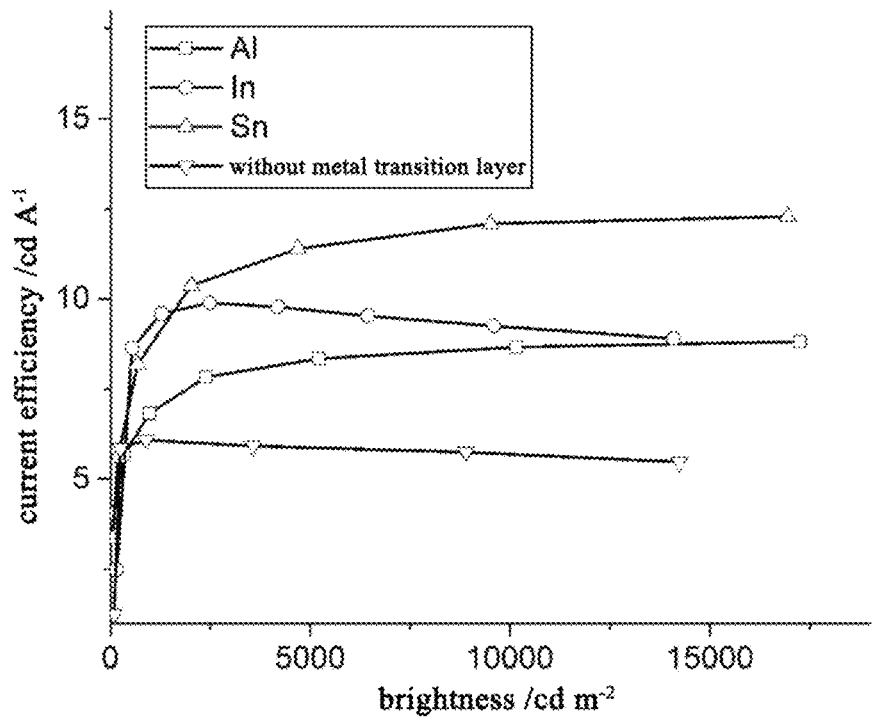
FIG. 8 is a graph showing brightness-current efficiency relationships of QLED-1, QLED-2 and QLED-3 according to an embodiment of the present disclosure with according to a control embodiment QLED-0.
Figure 9:
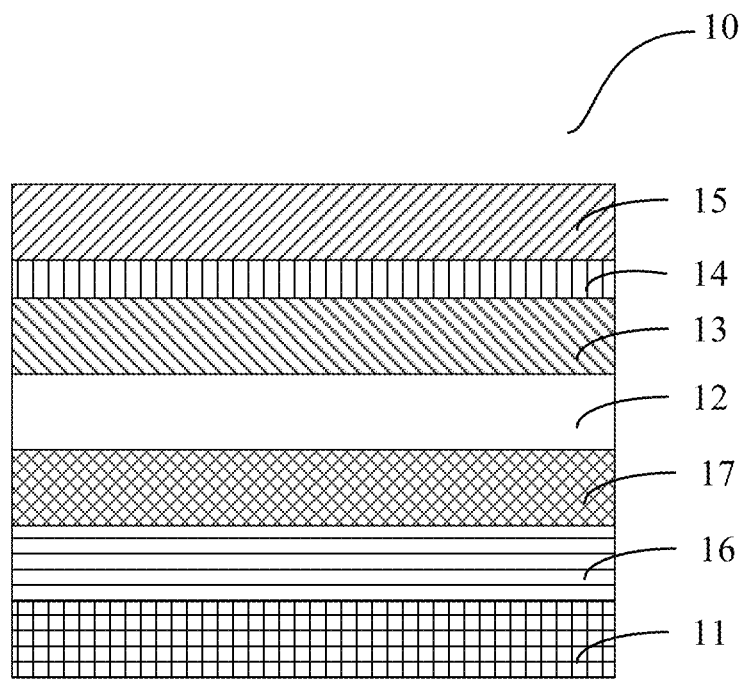
FIG. 9 is a schematic view showing a light emitting diode according to another embodiment of the present disclosure.

Further, in the case where the materials, structures, and thicknesses of other film layers are identical exactly, the light emitting diodes QLED-1, QLED-2 and QLED-3 shown in FIG. 9 having the metal transition layer made of metals aluminum, indium, and, as well as the light emitting diode QLED-0 without metal transition layer are prepared, respectively. The metal transition layer was deposited by the thermal decomposition method of the present disclosure at a deposition rate of 2 Å/s. One of the constituents of the light emitting diode of the present disclosure is shown as follows: glass substrate/ITO (200 nm)/PEDOT: PSS (10 nm)/TFB (20 nm)/TCTA (10 nm)/ZnO (200 nm)/Sn (10 nm)/IZO (200 nm). Other devices differ from each other merely in the constituent material of the metal transition layer. QLED-0 has no metal transition layer. The QLED-1, QLED-2, QLED-3, and QLED-0 are powered separately, and the brightness and current of the four devices are measured to calculate the current efficiency. As shown in FIG. 8, a luminance-current efficiency graph of QLED-1, QLED-2, QLED-3, and QLED-0 is obtained. As can be seen from FIG. 8, the luminance efficiency of QLED-1, QLED-2, and QLED-3 is improved as compared with that of QLED-0, and in particular, the current efficiency of QLED-3 is significantly improved. The performance test results are consistent with the surface roughness results observed in FIGS. 2 to 4: the roughnesses of the metal transition layers in QLED-1, QLED-2, and QLED-3 are increased sequentially. Therefore, the roughness of the metal transition layer formed by the deposition is positively correlated with the current efficiency of the QLED device.

The rough surface of the metal transition layer prepared from the above materials has a discontinuous island profile, and the island shape has protrusions with a height h2, calculated from the surface of the metal transition layer, less than or equal to 3 nm, 4 nm, 5 nm, 8 nm, or even less than or equal to 10 nm. The height of the protrusion depends on the thickness of the prepared metal transition layer. The discontinuous island profile has a positive influence on the light output, so that the rays of light are less susceptible to specular reflection. Moreover, the exit angles of the rays of light are different, and these rays of light can also form interference of light, so that the intensity of the transmitted rays of light is high, which has a positive influence on the exit light.

In the light emitting diode of an optional embodiment of the present disclosure, a metal transition layer is prepared from a material having a work function $W_F$ between the LUMO of the material of the electron transport layer and the work function $W_F$ of the material of the cathode. Optionally, the material for preparing the metal transition layer is at least one metal of metals Al, In, Ag, and Sn; or a mixed material of tin and an oxide of tin. Further optionally, the material for preparing the metal transition layer is: Al, In, Sn, Ag, Sn—Al or Sn—Ag alloy, and oxides of tin and tin. The difference in work function between the electron transport layer and the cathode can be adjusted by a metal transition layer made of these materials. Moreover, when the metal transition layer is composed of an alloy material or an oxide material of tin and tin, the difference in work function between the electron transport layer and the cathode can be further adjusted by adjusting the ratio among the metals or the ratio between tin and the oxide of tin. Thus, the metal transition layer of the present disclosure improves the efficiency of the QLED device. Optionally, the alloy material is tin and at least one of other metals, such as silver, aluminum, and indium. Further optionally, the atomic ratio of tin to other metals, such as silver, aluminum or indium, is from 5:1 to 1:1, and even the atomic ratio is optionally from 3:1 to 1:1. The atomic ratio ultimately depends on the material of the electron transport layer and the material of the cathode, as long as the ratio is suitable for adjusting the difference in the work function between the metal transition layer and the electron transport layer.

Optionally, the material for preparing the metal transition layer is a mixture of tin and an oxide of tin. Tin has a high matching degree with the electron transport layer, and tin oxide can improve the matching degree between the metal transition layer and the cathode (transparent conductive oxide). Therefore, the use of a mixture of tin and an oxide of tin can further reduce the difficulty of carrier injection. In the mixture of tin and an oxide of tin, the molar content of metal tin may be 50% or more, for example, 60%, 70%, 80% or 90%.

Optionally, the metal transition layer has a thickness of 0.5 nm to 15 nm, and the metal transition layer has a relatively thin thickness, which is beneficial to enhance light transmission. Further optionally, the metal transition layer has a thickness of 3.5 nm to 15 nm, or even 5 nm to 10 nm, and the surface roughness of the metal transition layer may be 1 nm to 10 nm, even 3 nm to 10 nm, or even more from 3 nm to 8 nm.

In the discontinuous island profile formed by depositing a metal transition layer on the electron transport layer, the island shape has a protrusion height of less than or equal to 10 nm. Therefore, in order to balance the light transmittance of the metal transition layer and the embedding degree of the metal transition layer into the electron transport layer, the thickness of the metal transition layer is optionally 5 nm to 10 nm. At this time, the metal transition layer has strong light transmission and the embedding degree into the electron transport layer is high, and the effective area of carrier injection is large, which contributes to reducing the difficulty of carrier injection.

Optionally, the metal transition layer is formed by depositing a material on the electron transport layer by sputtering, thermal decomposition or atomic layer deposition.

Optionally, the transparent conductive oxide material is ITO or IZO.

Optionally, the cathode has a layer thickness of 50 to 5000 nm.

Optionally, the electron transport layer is made of zinc oxide (ZnO).

Optionally, in some other embodiments of the present disclosure, the light emitting diode 10 may further include a hole inject layer 16 (HIL) and a hole transport layer 17 (HTL), as shown in FIG. 9. The hole injection layer 16 is located between the hole transport layer 17 and the anode 11, and the hole transport layer 17 is located between the hole injection layer 16 and the light emitting layer 12.

Optionally, the hole injection layer is made of poly(3,4-ethylenedioxythiophene)-poly(styrenesulfonate) (PEDOT: PSS). Optionally, the hole transport layer is made of poly (9,9-dioctylfluorene-co-N-(4-butylphenyl)diphenylamine) (TFB).

Optionally, the light emitting diode is a light emitting diode of a top emitting structure. The top emitting structure of the light emitting diode enables narrow-band emission, thereby further enhancing the color purity of the emitted light.

In an embodiment of the present disclosure, the light emitting diode includes a metal transition layer, thereby forming a microcavity. The cavity length of the microcavity can be adjusted as needed. Specifically, a microcavity having an adjustable cavity length can be formed by adjusting the thicknesses of the cathode, the electron transport layer, the light emitting layer, the hole transport layer, and/or the hole injection layer. Thereby, the light distribution is regulated, thereby further positively affect the light emission.

In an optional embodiment of the present disclosure, there is also provided a display substrate, including any of the above light emitting diodes.

In an optional implementation of the present disclosure, there is also provided a display device, including any of the above light emitting diodes or any of the above display substrates. Specifically, but not limited to the following examples, the display device may include: a substrate, a thin film transistor array formed on the substrate, an anode located on the thin film transistor array, a hole injection layer formed on the anode, a hole transport layer formed on the hole injection layer, a light emitting layer formed on the hole transport layer, an electron transport layer formed on the light emitting layer, a cathode formed on the electron transport layer, a package cover plate arranged above the cathode and attached to the substrate, and a sealant frame for bonding the substrate and the package cover plate.

In an embodiment of the present disclosure, a method for preparing a light emitting diode is provided, the method including: preparing an anode, a light emitting layer, and an electron transport layer; preparing a metal transition layer, the metal transition layer being made of a material having a work function $W_F$ between an LUMO of a material of the electron transport layer and a work function $W_F$ of a material of the cathode; and preparing a cathode, the cathode being made of a transparent conductive oxide material.

Figure 10:
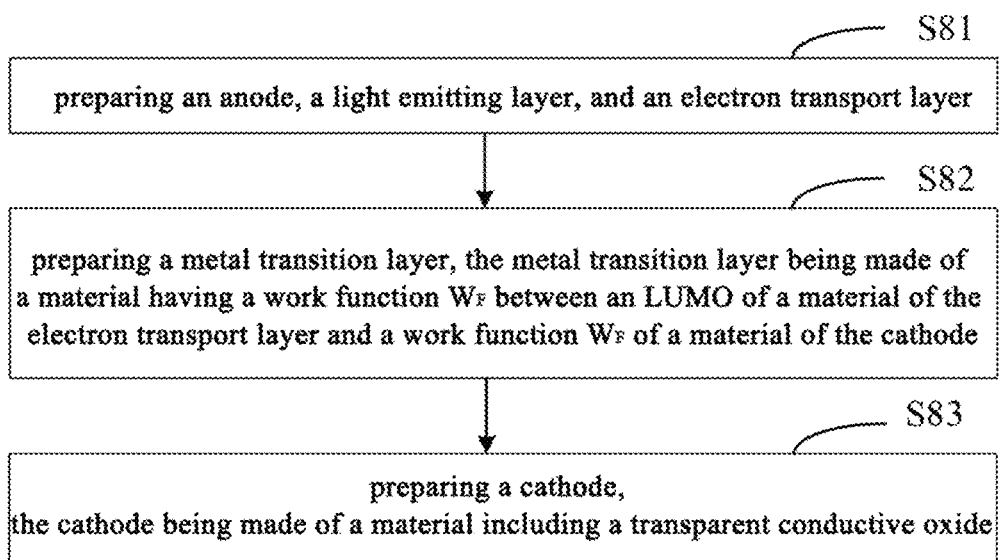
FIG. 10 is a schematic flow chart showing a method for preparing a light emitting diode according to an embodiment of the present disclosure.

FIG. 10 shows a schematic flow chart showing a method for preparing a light emitting diode according to an embodiment of the present disclosure. The method includes the following steps S81 to S83.

Step S81: sequentially preparing an anode, a light emitting layer, and an electron transport layer. Specifically, the anode, the light emitting layer, and the electron transport layer can be prepared sequentially by spin coating, coating, or the like in a dry nitrogen atmosphere.

Step S82: preparing a metal transition layer on the electron transport layer, the metal transition layer being made of a material having a work function $W_F$ between an LUMO of a material of the electron transport layer and a work function $W_F$ of a material of the cathode.

Step S83: preparing a cathode on the metal transition layer, the cathode being made of a transparent conductive oxide material.

Figure 11:
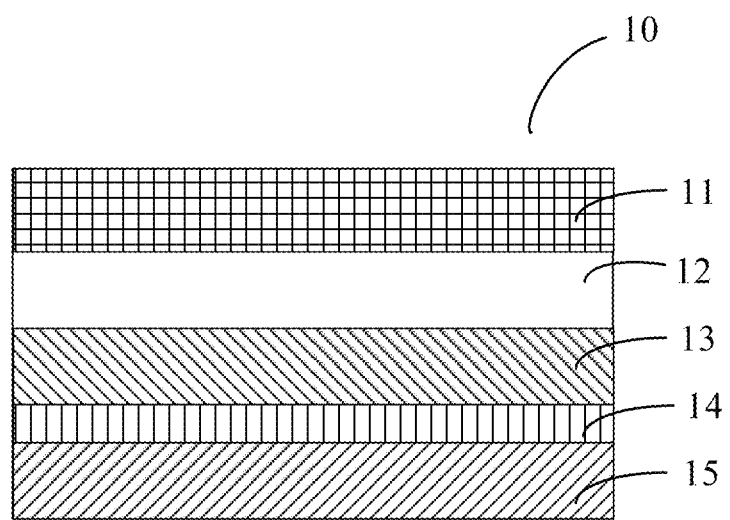
FIG. 11 is a schematic view showing a light emitting diode according to another embodiment of the present disclosure.

The above preparation method is merely an example of the present disclosure, but is not limited to the above method for preparing the light emitting diode of the present disclosure, and may be prepared by other methods. For example, a light emitting diode having a structure as shown in FIG. 1 can be obtained first by preparing an anode, followed by preparing a metal light emitting layer and an electron transport layer, and then by preparing a metal transition layer, a cathode, and the like; or a light emitting diode having a structure as shown in FIG. 11 can be obtained first by preparing a cathode, followed by preparing a metal transition layer and an electron transport layer, and then by preparing a light emitting layer, an anode, and the like.

As for the light emitting diode prepared by the preparation method of the embodiment of the present disclosure, the metal transition layer is composed of a material having a work function $W_F$ between the LUMO of the material of the electron transport layer and the work function $W_F$ of the material of the cathode, which facilitates the carrier injection of the cathode, thereby being capable of reducing the operating voltage applied to the light emitting diode, and further being capable of increasing its service life.

Optionally, the light emitting layer in step S81 is a quantum dot light emitting layer, and the light emitting diode prepared by the preparation method of the embodiment of the present disclosure is a quantum dot light emitting diode.

Optionally, the material of the metal transition layer is a metal Al, In, Ag or Sn. Moreover, the step of preparing the metal transition layer on the electron transport layer includes depositing a metal or an alloy on the electron transport layer by sputtering, thermal decomposition or atomic layer deposition, to obtain the metal transition layer made of the metal or the alloy. From the perspective of the efficiency of the prepared light emitting diode, a metal Sn, In or Al may be optionally used, and even a metal Sn is more preferably used.

Optionally, when thermal decomposition method is used, tin may be deposited by annealing $SnH_4$ adduct. That is, $SnH_4$ solution is sprayed or spin-coated on the electron transport layer. The $SnH_4$ solution contains the adduct $SnH_4$, which is then thermally decomposed into tin and $H_2$, to obtain the metal transition layer made of tin. The adduct is a nitrogen-containing adduct, to maintain the stability of the $SnH_4$ solution and allow the $SnH_4$ to be present in solution in a liquid form, which facilitates subsequent reactions. Optionally, when atomic layer deposition is used, the substrate can be placed in a vacuum deposition system to deposit 5 to 10 nm of metal Sn at a deposition rate of 0.5 to 3 Å/s, for example, 1 to 2 Å/s.

Optionally, the tin-containing material is an alloy of tin and other metals. The preparing the metal transition layer on the electron transport layer includes depositing tin and other metals on the electron transport layer by sputtering, thermal decomposition or atomic layer deposition, to obtain the metal transition layer made of the alloy of tin and other metals.

For example, tin and other metals can be deposited in a co-evaporated form, a desired ratio of metal alloy is achieved by controlling the deposition rate of tin and other metals, and a metal transition layer made of an alloy or solid solution of tin and other metals is obtained after the deposition.

Optionally, the other metals include at least one of silver, aluminum, and indium. Further, metal aluminum or indium is used as the other metal.

Optionally, the tin-containing material is a combination of tin and an oxide of tin, and the preparing the metal transition layer on the electron transport layer includes: depositing tin on the electron transport layer by sputtering, thermal decomposition or atomic layer deposition, and performing an oxygen plasma treatment on the deposited tin, to produce the metal transition layer made of an oxide of tin and tin. At this time, the tin oxide in the metal transition layer can improve the matching degree between the metal transition layer and the cathode, thereby further reducing the difficulty of carrier injection.

Optionally, the transparent conductive oxide material is ITO or IZO. Optionally, the transparent conductive oxide material layer can be prepared by sputter deposition. The parameters of the deposition process are: depositing ITO or IZO with a thickness of 50 to 500 nm under argon (Ar) at a flow rate of 10 to 100 sccm at 0.1 to 15 Pa.

Optionally, the light emitting diode of the top emission structure prepared by the above preparation method enables narrow-band emission, thereby further enhancing the color purity of the emitted light.

Optionally, the above step S81 includes sequentially preparing an anode, a hole injection layer, a hole transport layer, a light emitting layer, and an electron transport layer on the base substrate. Further optionally, the anode, the hole injection layer, the hole transport layer, the light-emitting layer, and the electron transport layer may be sequentially prepared in a dry nitrogen atmosphere.

Optionally, PEDOT:PSS may be deposited on the anode to form a hole injection layer.

Optionally, TFB may be deposited on the hole injection layer to form a hole transport layer.

Optionally, zinc oxide may be deposited on the light emitting layer to form an electron transport layer.

The light emitting diode prepared by the method for preparing the light emitting diode of the embodiment of the present disclosure includes a metal transition layer, thereby forming a microcavity. The cavity length of the microcavity can be adjusted as needed. Specifically, a microcavity having an adjustable cavity length can be formed by adjusting the thicknesses of the cathode, the electron transport layer, the light emitting layer, the hole transport layer, and/or the hole injection layer. Thereby, the light distribution is regulated, thereby further positively affect the light emission.

Unless otherwise defined, technical terms or scientific terms used herein have the normal meaning commonly understood by one skilled in the art in the field of the present disclosure. The terms "first", "second", and similar terms used in the description and claims of the present disclosure do not denote any order, quantity, or importance, but rather merely serves to distinguish different components. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

The above description is the optional embodiment of the present disclosure. It should be noted that one skilled in the art would make several improvements and substitutions without departing from the principles of the present disclosure. These improvements and modifications should also be regarded as the protection scope of the present disclosure.

What is claimed is:

1. A light emitting diode, comprising an anode, a light emitting layer, an electron transport layer, a cathode, and a metal transition layer located between the electron transport layer and the cathode, wherein the cathode comprises a transparent conductive oxide material, and a material of the metal transition layer has a work function $W_F$ between an LUMO of a material of the electron transport layer and a work function $W_F$ of a material of the cathode.

2. The light emitting diode of claim 1, wherein the metal transition layer is in contact with the cathode, and a surface of the metal transition layer in contact with the cathode has a roughness Rms greater than 1.0 nm, wherein the roughness is a roughness measured in an AFM photograph and expressed in a calculated root mean square.

3. The light emitting diode of claim 2, wherein a surface of the metal transition layer in contact with the cathode has a roughness of 1.0 nm to 5.0 nm.

4. The light emitting diode of claim 1, wherein the metal transition layer is made of at least one metal of metals Al, In, Ag, and Sn.

5. The light emitting diode of claim 4, wherein the metal transition layer is made of metal Sn, Sn—Al or Sn—Ag alloy.

6. The light emitting diode of claim 1, wherein the metal transition layer is made of a mixed material of metal tin and an oxide of tin.

7. The light emitting diode of claim 6, wherein the metal tin has a molar ratio of 50% or more in the mixed material.

8. The light emitting diode of claim 1, wherein the metal transition layer has a thickness of 1.5 nm to 15 nm.

9. The light emitting diode of claim 1, wherein a surface of the metal transition layer in contact with the cathode has a discontinuous island profile, and the island profile has a protruding height less than or equal to 10 nm.

10. A display device, comprising the light emitting diode claim 1.

11. The display device of claim 10, wherein the metal transition layer is in contact with the cathode, and a surface of the metal transition layer in contact with the cathode has a roughness Rms greater than 1.0 nm, wherein the roughness is a roughness measured in an AFM photograph and expressed in a calculated root mean square.

12. The display device of claim 11, wherein a surface of the metal transition layer in contact with the cathode has a roughness of 1.0 nm to 5.0 nm.

13. A method for preparing a light emitting diode, comprising:
   preparing an anode, a light emitting layer, and an electron transport layer;
   preparing a metal transition layer; and
   preparing a cathode, the cathode being made of a material comprising a transparent conductive oxide,
   wherein the metal transition layer is located between the electron transport layer and the cathode, and a material of the metal transition layer has a work function $W_F$ between an LUMO of a material of the electron transport layer and a work function $W_F$ of a material of the cathode.

14. The method of claim 13, wherein the metal transition layer is in contact with the cathode, and a surface of the metal transition layer in contact with the cathode has a roughness greater than 1.0 nm, wherein the roughness is a roughness measured in an AFM photograph and expressed in a calculated root mean square.

15. The method of claim 13, wherein the metal transition layer is made of at least one metal of metals Al, In, Ag, and Sn.

16. The method of claim 13, wherein the metal transition layer is made of a mixed material of metal tin and an oxide of tin.

17. The method of claim 13, wherein the step of preparing the metal transition layer comprises:

depositing the metal transition layer by sputtering process, thermal decomposition process, or atomic layer deposition process.

18. The method of claim 17, wherein the metal transition layer has a deposition rate of 0.5 to 3 Å/s, the deposition rate being expressed by a thickness of a layer formed by deposition per unit time.

19. The method of claim 17, wherein the metal transition layer is made of a mixed material of metal tin and an oxide of tin, and the method further comprises:
performing an oxygen plasma treatment on a deposited tin, to produce the metal transition layer made of an oxide of tin and tin.

20. The method of claim 17, wherein the step of preparing the metal transition layer on the electron transport layer comprises:
depositing metal Sn by thermally decomposing $SnH_4$ adduct, and depositing a metal transition layer on the electron transport layer.

* * * * *